United States Patent [19]

Kobayashi

[11] Patent Number: 5,343,144
[45] Date of Patent: Aug. 30, 1994

[54] ELECTRONIC DEVICE

[75] Inventor: Yuji Kobayashi, Kanagawa, Japan

[73] Assignee: Sony Corporation, Tokyo, Japan

[21] Appl. No.: 838,874

[22] Filed: Feb. 21, 1992

[30] Foreign Application Priority Data

Feb. 28, 1991 [JP] Japan ................................. 3-058155
Feb. 28, 1991 [JP] Japan ................................. 3-058156

[51] Int. Cl.$^5$ ................................................ G01R 31/28
[52] U.S. Cl. ............................... 324/158.1; 324/73.1; 371/22.5
[58] Field of Search ............... 324/158 R, 23.1; 371/15.1, 22.5; 364/571.01, 571.03, 571.07, 579, 480–483

[56] References Cited

U.S. PATENT DOCUMENTS

| | | | |
|---|---|---|---|
| 3,906,163 | 9/1975 | Brenski et al. | 371/15.1 |
| 4,138,599 | 2/1979 | Munter | 371/15.1 |
| 4,217,651 | 8/1980 | Pickering | 364/571.03 |
| 4,335,425 | 6/1982 | Goto et al. | 371/15.1 |
| 4,402,055 | 8/1983 | Lloyd et al. | 364/579 |
| 4,545,010 | 10/1985 | Salas et al. | |
| 4,563,736 | 1/1986 | Boudreau et al. | |
| 4,630,224 | 12/1986 | Sollman | 364/579 |
| 4,816,993 | 3/1989 | Takahashi et al. | 395/250 |
| 4,835,674 | 5/1989 | Collins et al. | |
| 4,858,615 | 8/1989 | Meinema | 364/571.01 |
| 4,884,228 | 11/1989 | Stanley et al. | 364/579 |
| 4,964,124 | 10/1990 | Burnett | 371/15.1 |
| 4,992,970 | 2/1991 | Igarashi | 371/15.1 |
| 5,051,996 | 9/1991 | Bergeson et al. | 371/15.1 |
| 5,089,979 | 2/1992 | McEachern et al. | 364/571.07 |
| 5,090,015 | 2/1992 | Dabbish et al. | 371/22.5 |

FOREIGN PATENT DOCUMENTS 2195028 3/1988 United Kingdom .

OTHER PUBLICATIONS dtk Advertizement; Byte; IBM Special Edition (1989); p. 12.

Club Computer Corporation Advertizement; PC Magazine; Sep. 24, 1991; p. 22.

Primary Examiner—Ernest F. Karlsen
Attorney, Agent, or Firm—William S. Frommer; Alvin Sinderbrand

[57] ABSTRACT

An electronic device has a main-wiring board with a control circuit and a plurality of sub-wiring boards connected to the main-wiring board. Each sub-wiring board has at least one circuit block having an operational setting, and a memory circuit in which operational setting data for the circuit block are stored. The control circuit on the main-wiring board controls the operation settings of the circuits on the respective wiring boards on the basis of the operation setting data stored in the memory circuit.

6 Claims, 11 Drawing Sheets

| THROTTLE NO. | FIRST EDITING DEVICE | SECOND EDITING DEVICE | THROTTLE ADDRESS |
|---|---|---|---|
| 1 | CPU BOARD | CPU BOARD | LLLLH |
| 2 | GENERATOR BOARD A | GENERATOR BOARD B | LLLHL |
| 3 | WIPE GENERATOR | WIPE GENERATOR | LLLHH |
| 4 | WIPE GENERATOR | WIPE GENERATOR | LLHLL |
| 5 | KEY PROCESSOR | KEY PROCESSOR | LLHLH |
| 6 | MIXING BOARD | MIXING BOARD | LLHHH |
| 7 | KEY PROCESSOR | KEY PROCESSOR | LHLLL |
| 8 | MIXING BOARD | MIXING BOARD | LHLLH |
| 9 | MIXING BOARD | MIXING BOARD | LHLHL |
| 10 | OUTPUT BOARD | OUTPUT BOARD | LHLHH |
| 11 | (CHROMA KEY BOARD A) | (CHROMA KEY BOARD B) | LHHLL |
| 12 | (CHROMA KEY BOARD A') | (CHROMA KEY BOARD B') | LHHLH |
| 13 | MAT GENERATOR | MAT GENERATOR | LHHHL |
| 14 | MEMORY BOARD | MEMORY BOARD | LHHHH |
| 15 | INPUT BOARD | INPUT BOARD | HLLLL |
| 16 | (INPUT BOARD) | (INPUT BOARD) | HLLLH |
| 17 | (INPUT BOARD) | (INPUT BOARD) | HLLHL |
| 18 | INPUT BOARD | INPUT BOARD | HLLHH |

| PAGE | CONTENT | |
|---|---|---|
| 0 | MEMORY CHECK | CONTROL INFORMATION |
| 1 | FORMAT | |
| 2~5 | SWITCH DATA<br>VOLUME DATA<br>TEMPERATURE DATA | |
| 6~9 | NAME OF COMPANY<br>MANUFACTURING<br>  YEAR, MONTH, DATE<br>NAME OF BOARD<br>VERSION<br>NAME OF OPTION<br>LOT NO.<br>SERIAL NO.<br>NAME OF TYPE<br>PARTS NO. | PRODUCT INFORMATION |
| 10~15 | SERVICE DATE,<br>  TIME<br>CONTENT | SERVICE INFORMATION |

ELECTRONIC DEVICE

BACKGROUND OF THE INVENTION

This invention relates to an electronic device, and more particularly is suitably applied to an electronic device such as e.g., an editing device.

In a conventional electronic device such as an editing device, a mother board has mounted thereon card boards such as a reference signal generating circuit board, a mixed circuit board and an input circuit board. The circuit boards are packaged at a high efficiency on the whole.

For this reason, when adjusting the respective card boards, an extension wiring board is interposed between the card boards and the mother board. The card boards are pulled out of the mother board, to thereby permit adjustment of a half-fixed resistor, a dip switch, and so fourth.

It is desirable for the individual card boards to be adjustable without taking the trouble to interpose the extension wiring board, so as to simplify this type of adjusting operation.

SUMMARY OF THE INVENTION

In view of the foregoing, an object of this invention is to provide a electronic device in which the adjusting operation is simplified.

In the present invention, there is provided a electronic device 1 comprising: a main-wiring board 10A; and a plurality of sub-wiring boards 10B-10R connected to the main-wiring board 10A, characterized in that: the plurality of sub-wiring boards 10B-10R include memory circuits 48 for storing data for adjusting the sub-wiring boards 10B-10R; and the main-wiring board 10A adjusts the sub-wiring boards 10B-10R on the basis of the data for storing the sub-wiring boards 10B-10R which are stored in the memory circuits 48.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
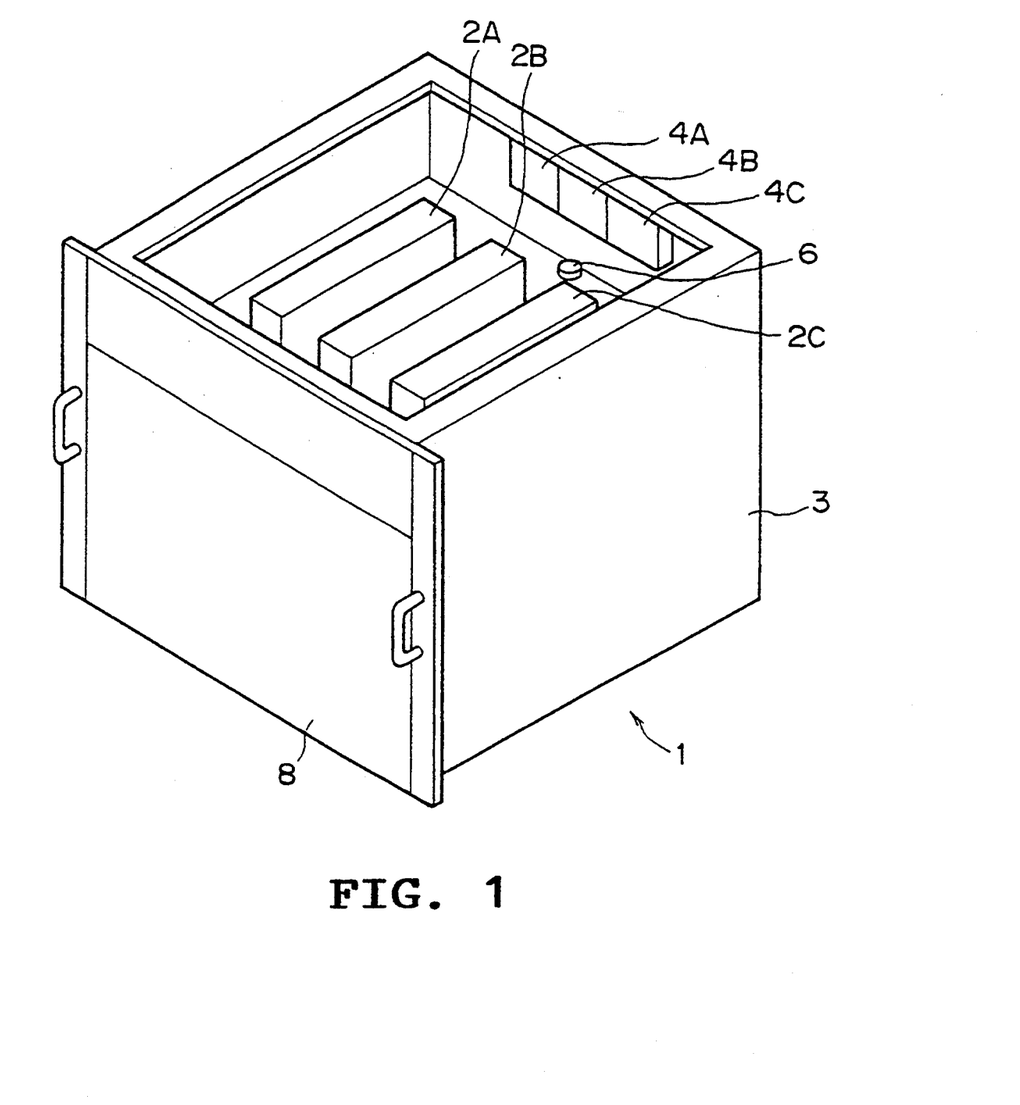
FIG. 1 is a perspective view depicting one embodiment of the electronic device according to the present invention.

Preferred embodiments of this invention will be described with reference to the accompanying drawings:

Designated generally at 1 in FIG. 1 is an editing device accommodated in a predetermined adjustment desk and capable of edit processing while being connected to a switcher on the control desk.

Hence, in the editing device 1, an interior of a box 3 is divided into upper and lower portions. Disposed in the upper portion thereof are first through third power supplies 2A-2C, consisting of switching regulator circuits, and air cooling fans 4A-4C.

Also in the upper portion of the box 3, a thermistor 6 is interposed between the power supplies 2A-2C and the fans 4A-4C. A temperature of the upper portion of the box 3 is thus detectable through the thermistor 6.

Figure 2:
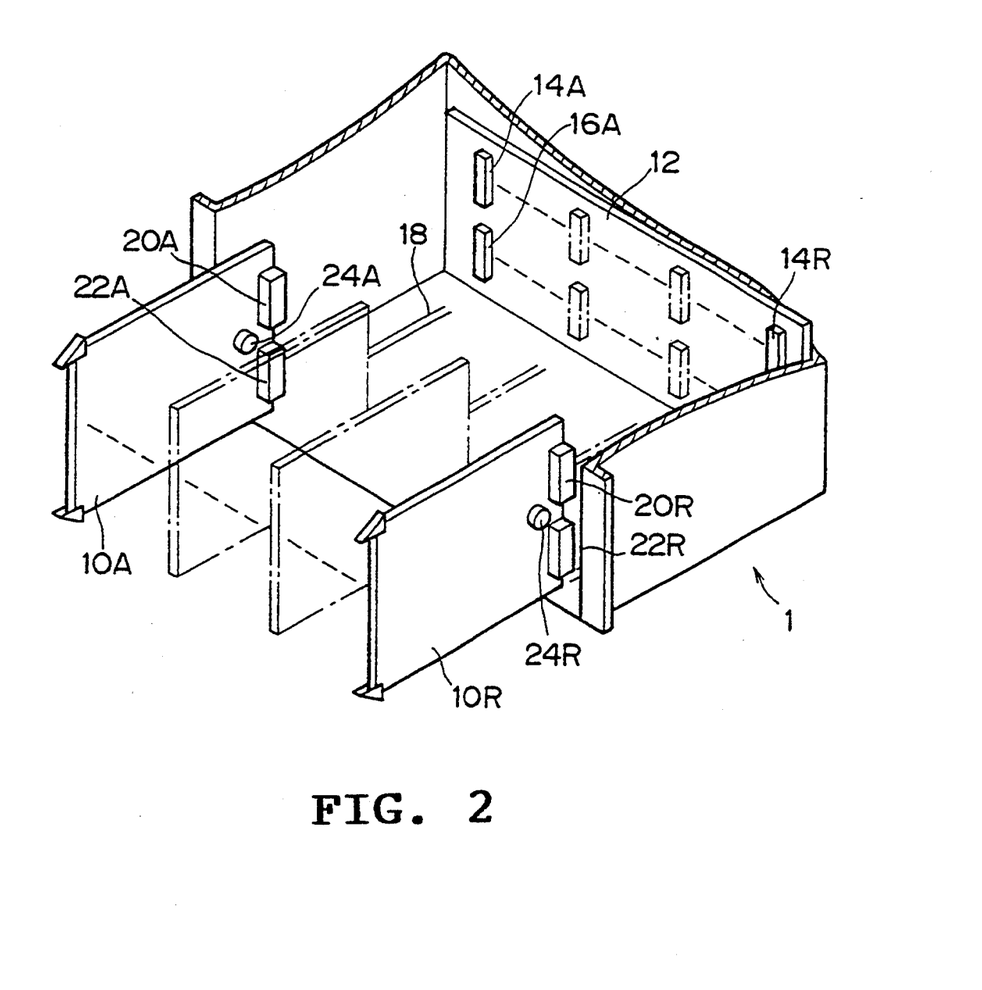
FIG. 2 is a perspective view depicting a detailed partial construction of the electronic device shown in FIG. 1.

A panel 8 is attached to the front surface of the lower portion of the box 3. As illustrated in FIG. 2, card boards 10A-10R are to be housed in an interior of the front surface panel 8.

To be more specific, a mother board 12 is disposed at the rear surface of the lower portion of the box 3. Connectors 14A-14R and 16A-16R are provided on the mother board 12.

With this arrangement, in the editing device 1, the card boards 10A-10R can be slid along guide rails 18. Connectors 20A-20R and 22A-22R of the card boards 10A-10R are respectively inserted in connectors 14A-14R and 16A-16R provided on the mother board 12, thus connecting the card boards 10A-10R to the mother board 12. The editing device 1 is thus constructed as a unit.

In the box 3, intrinsic throttle numbers or addresses are allocated to respective card board housing positions, which have predetermined types of card boards individually housed therein. Card boards dedicated to respective types of functions are housed in the corresponding predetermined types of housing positions in accordance with the desired nature of the editing units, thereby constructing first and second editing units incorporating different functions on the whole.

Figure 3:
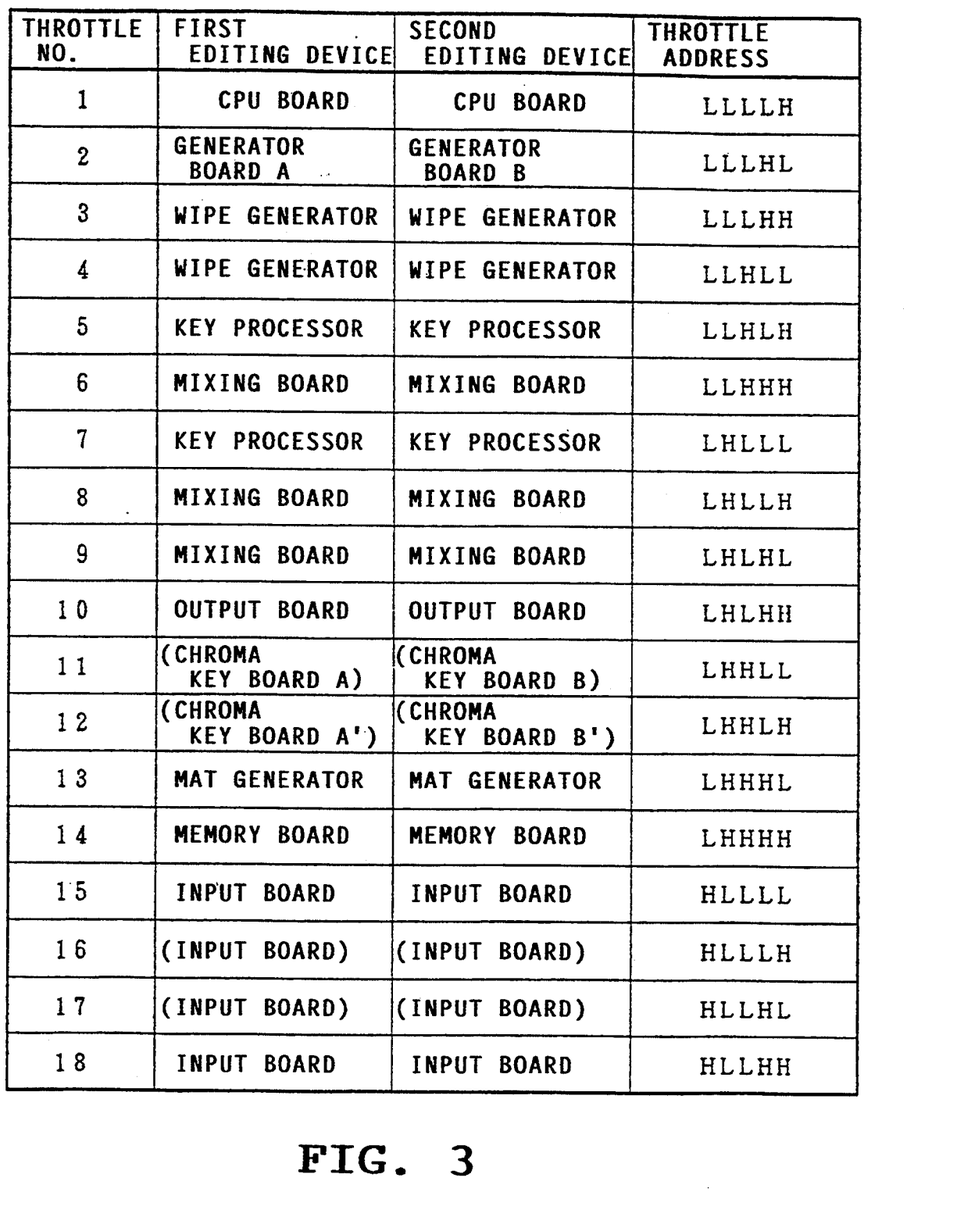
FIG. 3 is a table showing housing positions of card boards of the electronic device shown in FIG. 1.

More specifically, as illustrated in FIG. 3, the editing device 1 houses a CPU card board in the housing position marked with the throttle number 1. The entire editing device 1 is controllable by use of the CPU board.

Further, the editing device 1 is arranged such that a dedicated generator card board A or B (for generating a variety of reference signals required for processing in the editing unit) is housed in a housing position marked with the throttle number 2 in each of the first and second editing units.

Furthermore, the editing device 1 is arranged such that a pair of card boards acting as wipe generators are housed in housing positions marked with the throttle numbers 3, 4, to thereby wipe desired video signals, while a key processor card board and a mixing card board are housed in housing positions with the throttle number 5, 6 to thereby effect dissolve processing.

Similarly, the editing device 1 is constructed so that a key processor card board and a mixing card board are housed in housing positions with the throttle numbers 7, 8. A mixing card board is set in a housing position with the throttle number 9, and an output card board for outputting a video signal is housed in a housing position with the throttle number 10.

The editing device 1 is further constructed such that a pair of chroma key card boards are housed in housing positions with the throttle numbers 11, 12, and in this case, a chroma key card board A or B which is different in operation depending on the first and second editing units is housed. The desired video signal is thereby chroma-key-processed.

Additionally, the editing device 1 is arranged in such a way that a mat generator card board for generating background colors is housed in a housing position with the throttle number 13. A still picture storage memory card board is different depending on the first and second editing units is housed in a housing position with the throttle number 14. Input card boards for inputting 8-channel video signals are housed in housing positions with the throttle numbers 15-18.

Each of the card boards 10A-10R has the same connection configuration and is therefore, even if inserted in a mistaken housing position, connectable to the mother board 12.

On the mother board 12, the connectors 14A-14R and 16A-16R are connected to corresponding card boards housed in the respective housing positions.

Further on the mother board 12, the electric power from a power supply 2A is supplied to the CPU board marked with the throttle number 1 via the connector 14A-14R and 16A-16R. The electric power from a power supply 2B is supplied to the card boards with the throttle numbers 2-9. The electric power from a power supply 2C is supplied to the card boards with the throttle numbers 10-18.

On the mother board 12, five terminals of the connectors 14A-14R are connected to the power supply or a ground line through a wiring pattern, thereby forming or hard-wiring throttle addresses ADS corresponding to the individual throttle numbers.

With this arrangement, in the editing device 1, after inserting the respective card boards, the throttle addresses ADS of the housing positions can be detected through the card boards.

Further on the mother board 12, the connectors 14A-14R are connected in common to form a bus BUS for a serial data transmission. The serial transmission of control data or the like together with predetermined clock signals can be effected on the bus line BUS.

Correspondingly on the card boards 10A-10R, connectors 22A-22R are assigned for signal transmission, while connectors 20A-20R cooperate to form a bus line.

Figure 4:
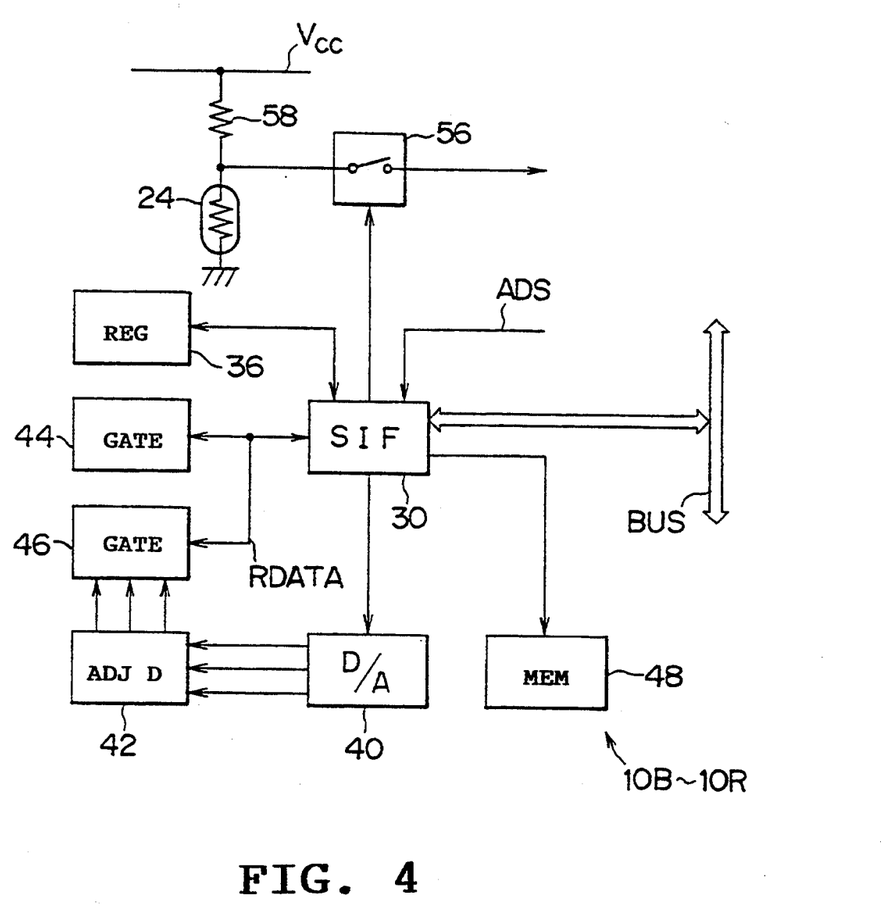
FIG. 4 is a block diagram showing the card board of the electronic device shown in FIG. 1.

Further, as illustrated in FIG. 4, a serial interface circuit 30 is connected to the bus line BUS of the respective connectors 20B-20R in each of the card boards 10B-10R other than the CPU card board 10A. The control data serially transmitted via the bus line BUS are thereby taken in, that is received, through the serial interface circuit 30. Simultaneously, various output data can be sent with the control data.

Figure 5A:
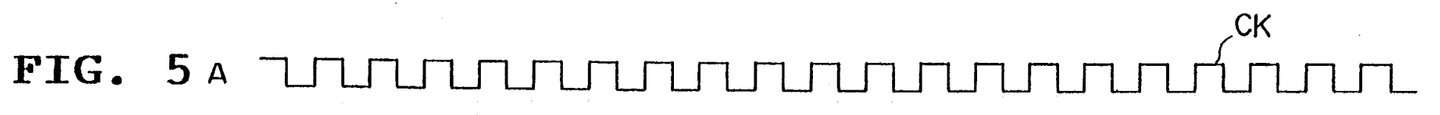
FIGS. 5a-5c are signal waveform diagrams showing data transmissions in the circuit on the card board shown in FIG. 4.
Figure 5B:
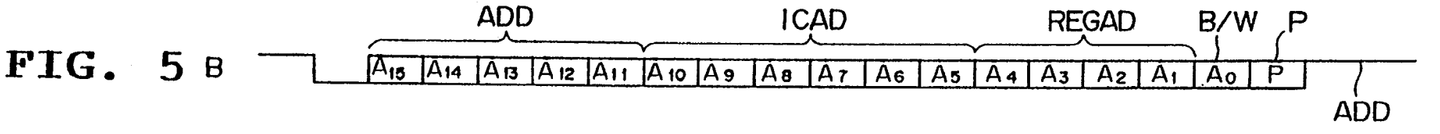
Figure 5C:
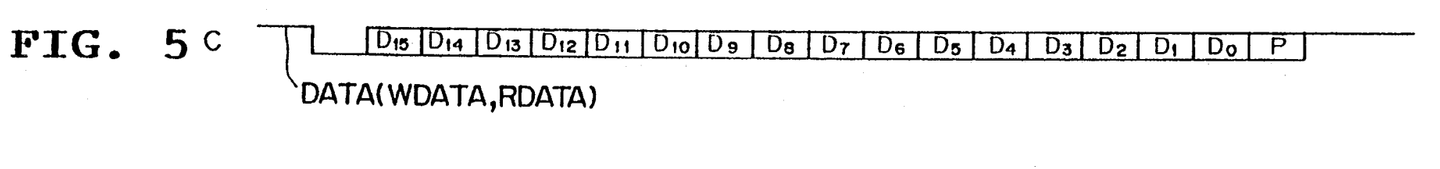
Figure 6:
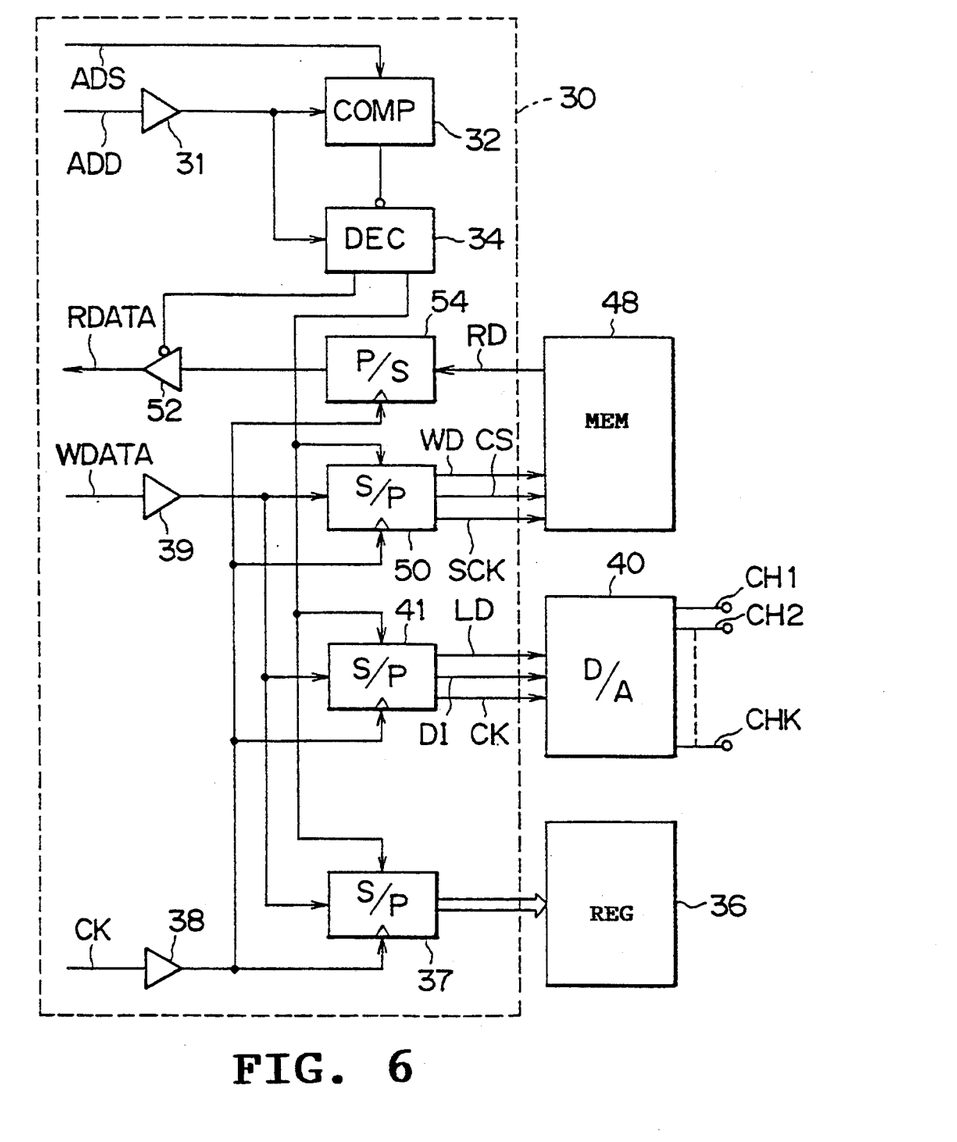
FIG. 6 is a block diagram depicting a serial interface circuit of the card board shown in FIG. 4.

As depicted in FIGS. 5 and 6, when address data ADD (FIG. 5B) are inputted on synchronization with clock signals CK (FIG. 5A), the serial interface circuit 30 feeds the address data ADD into a comparison circuit 32 via a buffer circuit 31.

The comparison circuit 32 receives the throttle addresses ADS of the card housing positions through the connectors 20B-20R. This circuit 31 detects whether or not the leading 5-bit data of the address data ADD coincides with the throttle address ADS.

If an affirmative result is obtained, the serial interface circuit 30 outputs a control signal to a decoder circuit 34. The decoder circuit 34 accordingly reads in the address data ADD.

The decoder circuit 34 detects whether there is an error in the address data ADD on the basis of a parity code P in a trailing portion of the address data ADD. If no error is detected, an integrated circuit specified by IC address data ICAD is accessed.

On the individual card boards 10A-10R, each circuit block is an integrated circuit, and an IC address ICAD is allocated to each integrated circuit.

Namely, when a register circuit 36 is specified by the IC address data ICAD, the decoder circuit 34 outputs a subsequent register address REGAD to a serial/parallel converting circuit 37.

The serial/parallel converting circuit 37 reads in the register address REGAD in response to the clock signal CK inputted via the buffer circuit 38. A conversion into parallel data is effected therein, and the parallel data is then outputted to the register circuit 36.

Further, the serial/parallel converting circuit 37 subsequently converts write data WDATA (FIG. 5C) inputted via a buffer circuit 39 into parallel data which is in turn outputted to the register circuit 36.

The register circuit 36 updates a region specified by the register address REGAD with the write data WDATA and holds the updated content.

The register circuits 36 are mounted on the card boards 10B-10R in place of conventional operation setting dip switches. The register circuit 36 updates the region specified by the register address REGAD with the write data WDATA, thereby changing the operational settings of the respective card boards 10B-10R.

In this type of editing device, the format of the video signal depends on its destination. It is therefore required that the operational settings of the card boards 10B-10R be changeable for every destination.

In the present embodiment, the content of the register circuit 36 is changed so as to easily switch the operational settings of the card boards 10B-10R.

Further, this kind of data is serially transmitted in the editing device 1, thus simplifying the whole construction.

When a digital/analog converting circuit 40 is specified by the IC address data ICAD, the following register address REGAD is outputted from decoder circuit 34 to the serial/parallel converting circuit 41.

The serial/parallel converting circuit 41 reads in the register address REGAD in response to the clock signal CK. A conversion into parallel data is performed therein, and the parallel data is then outputted to the digital/analog converting circuit 40.

Further, the serial/parallel converting circuit 41 converts the subsequently received write data WDATA into parallel data which is in turn outputted to the digital/analog converting circuit 40.

Correspondingly, the digital/analog converting circuit 40 converts the write data WDATA into analog signals and thereafter outputs these signals to channels CH1–CHK specified by the register address REGAD.

The digital/analog signal converting circuits 40 are mounted on the respective card boards 10B–10R in place of conventional half-fixed, that is, variable, resistors. These circuits 40 output the analog-conversion-processed output signals instead of operation characteristic setting reference signals which were outputted from the half-fixed resistors on a conventional board.

With this arrangement, the digital/analog converting circuit 40 converts the write data WDATA and thereby adjusts an adjusted circuit 42, shown in FIG. 4, of each of the card boards 10B–10R. The operation characteristics of the individual card boards 10B–10R are thus changed.

As a matter of fact, in this type of editing device, it is necessary to change the operation characteristics of the respective card boards as well as the formats of the video signals in accordance with the destinations and users.

Therefore, in this embodiment, the operation characteristics of the card boards 10B–10R are readily changed by changing the write data WDATA supplied to the digital/analog converting circuits 40.

When a gate circuit 44 or 46 is specified by the IC address data ICAD, the following register address REGAD is similarly outputted from the decoder circuit 34 to the gate circuit 44 or 46.

When a read/write bit R/W of the address data ADD rises to an "H" level, the decoder circuit 34 judges it as a read mode and outputs monitor data RDATA determined by the register address REGAD to the bus BUS via the gate circuit 44 or 46.

The gate circuit 44 or 46 takes a terminal voltage of the adjusted circuit 42 which is needed for detecting the operation of the adjusted circuit 42 through an analog/digital converting circuit (not shown) and thereafter outputs the voltage to the bus BUS via a serial/parallel converting circuit (not shown). In the editing device 1, the operation state of the adjusted circuit 42 can be thereby confirmed on the basis of the monitor data RDATA.

Further, when a memory circuit 48 is specified by the IC address data ICAD, the register address REGAD is output from the decoder circuit 34 to the serial/parallel converting circuit 50.

The serial/parallel converting circuit 50 takes in the register address REGAD and converts it into parallel data. The parallel data is then outputted to the memory circuit 48.

When the address data ADD is set in the read mode, the decoder circuit 34 switches the operation state of the buffer circuit 52 so that the contents of a region of the memory circuit 48 which is determined by the register address REGAD are outputted to the bus BUS through the parallel/serial converting circuit 54.

In the relevant editing device 1, the desired data stored in the memory circuit 48 are thereby sequentially read for each of the card boards 10B–10R.

Alternatively, when set to the write mode, the decoder circuit 34 controls and stops the operation of the buffer circuit 52. The write data WDATA inputted via the bus BUS is then stored in a region of the memory circuit 48 which is determined by the register address REGAD.

More specifically, the serial/parallel converting circuit 50 converts the register address REGAD into parallel data and outputs the data to the memory circuit 48.

The circuit 50 then converts the write data WDATA into parallel data and outputs the data to the memory circuit 48. The write data WDATA is thereby stored in a predetermined region of the memory circuit 48.

With this arrangement, in the editing device 1, the content of the memory circuit 48 is rewritable in such a state that the card boards 10B–10R are housed.

Figure 7:
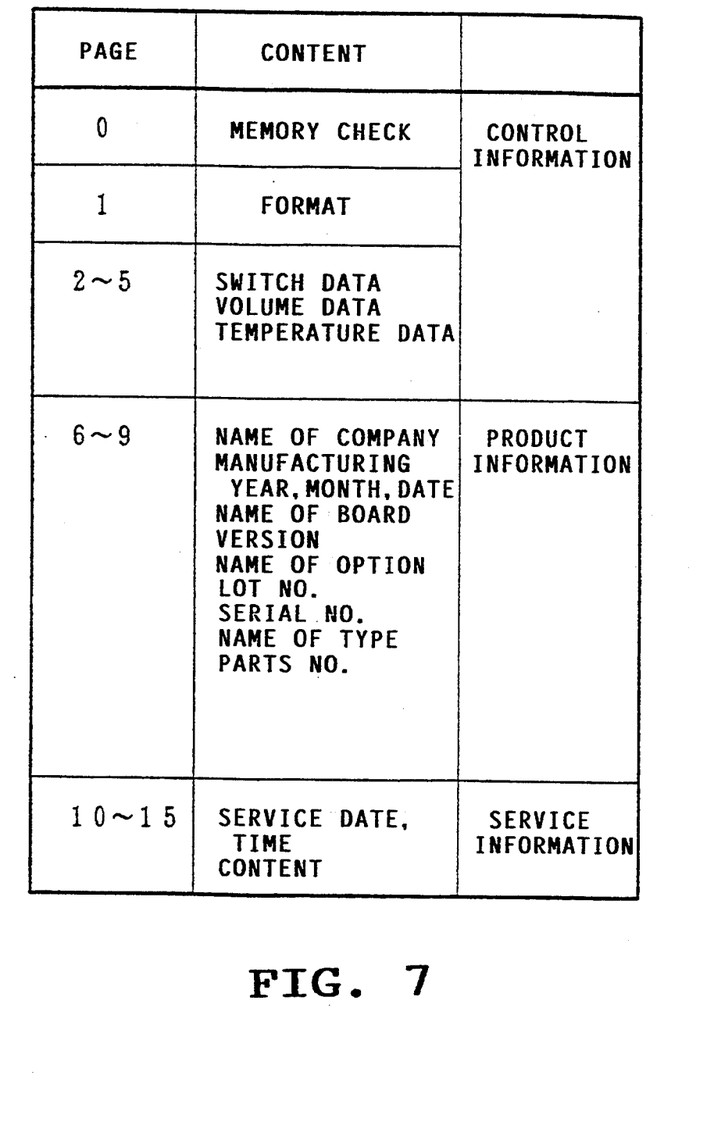
FIG. 7 is a table showing contents of a memory circuit shown in FIG. 6.

The memory circuit 48 is composed of a rewritable read-only memory circuit and is, as illustrated in FIG. 7, capable of storing information for 16 pages.

More specifically, the memory circuit 48 is capable of storing 32-byte data in every page, wherein self-diagnosis, that is, diagnostic, memory check data are stored in the 0th page.

The self-diagnosis memory check data are formed by adding common test data to the throttle addresses in which the respective card boards are housed.

The memory circuit 48 stores format data of the respective card boards in the 1st page, thereby identifying signal formats (such as, e.g., an NTSC system, etc.) of the individual card boards.

The memory circuit 48 stores data representing natures of the respective card boards in the 2nd–5th pages. The data stored therein include adjustment data (hereinafter referred to as volume data) of the adjusted circuit 42 and operational setting data (hereinafter referred to as switch data) of the register circuit 36.

The memory circuit 48 stores product management data for the individual card boards in the 6th–9th pages The data stored therein contain the names of manufacturing companies, manufacturing years, months and dates, lot numbers, and product serial numbers, etc. Also, a service person or the like is able to freely record service information on the 10th–15th pages.

The respective data of the memory circuit 48 are written therein by an adjustment process on the occasion of forwarding from the factory.

The predetermined data on the memory check, formats and product information are recorded in accordance with the destinations of the respective card boards. Contrastingly, with respect to the switch data and volume data, after being set to a test operation state by inputting a predetermined reference signal to the editing device 1, the predetermined data are recorded on the basis of the monitor data outputted via the gate circuits 44, 46.

With this arrangement, in the respective card boards 10B–10R, the adjusted circuit 42 is set and adjusted on the basis of the volume data and the switch data of the memory circuit 48. The characteristics of the card boards 10B–10R are thereby set and adjusted to those corresponding to the product serial numbers of the individual card boards.

Further, the decoder circuit 34, when specifying the throttle addresses ADS with the IC address data ICAD, takes in the throttle addresses ADS of the connectors 14B–14R and thereafter outputs the addresses ADS to a predetermined parallel/serial converting circuit (not shown).

With this arrangement, in the respective card boards 10B–10R, the throttle addresses ADS are transmitted subsequently to transmission of the data of the memory circuit 48. Whether or not the respective card boards 10B–10R are housed in the correct housing positions can thus be externally determined.

Besides, the decoder circuit 34, when specifying the thermistor 24 with the IC address data ICAD, outputs a control signal to a switch circuit 56. The switch circuit 56 is thereby switched to an ON-state.

The thermistors 24 are herein mounted substantially in the same positions (FIG. 2) on the rear sides of the individual card boards 10A–10R and connected via resistors 58 to a power supply line VCC.

The thermistor 24 outputs a terminal voltage on the side of the resistor 58 to the mother board 12 through the switch circuit 56. In the editing device 1, temperatures of the respective card boards 10A–10R are detectable through the thermistors 14A–24R.

Figure 8:
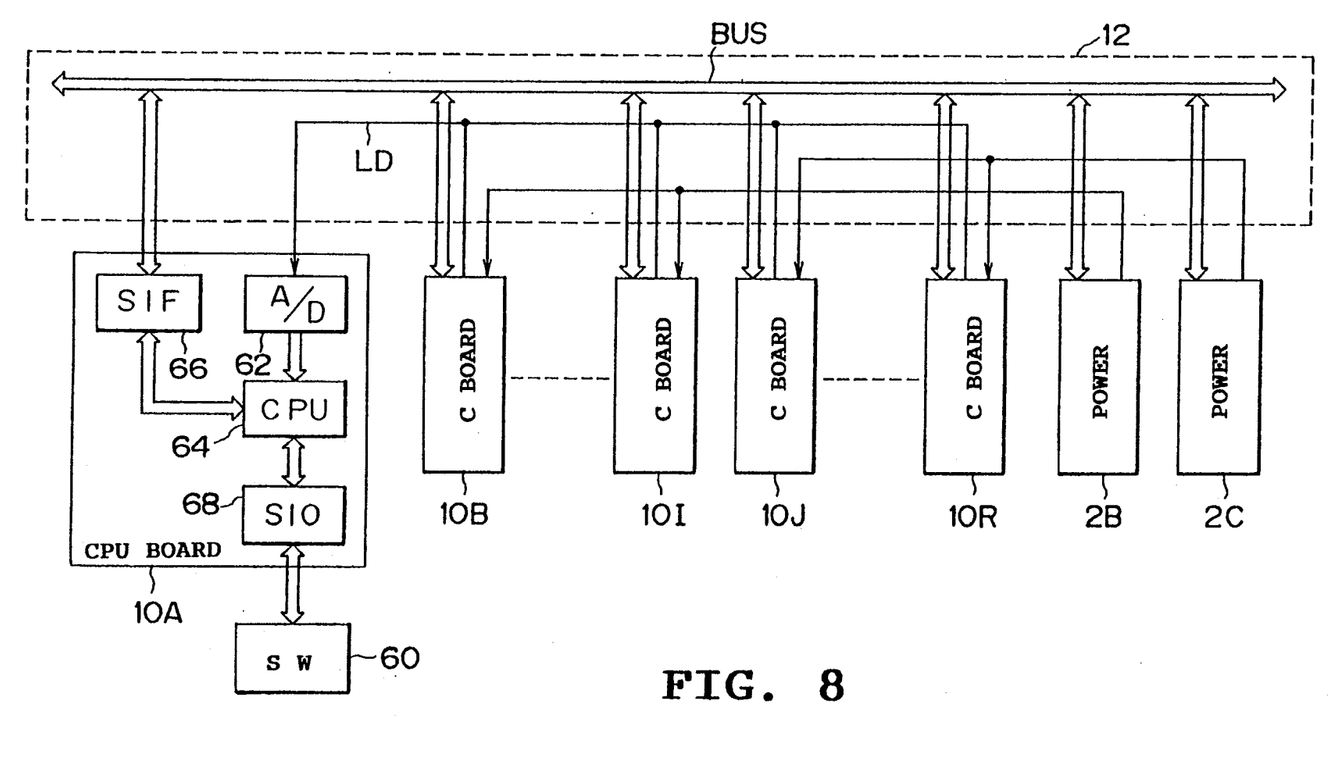
FIG. 8 is a block diagram illustrating a whole construction of an editing device of the electronic device according to the present invention.

As depicted in FIG. 8, the CPU board 10A is connected via mother board 12 to the respective card boards 10B–10R, whereby the operations of the card boards 10B–10R are changed corresponding to switchover of a switcher 60. The operation of the whole editing device 1 is thus changed.

The CPU board 10A selectively receives terminal voltages of the thermistors 24 mounted on the card boards 10B–10R through a data collection line LD and supplies the voltages to an analog/digital converting circuit 62.

Output data of the analog/digital converting circuit 62 is supplied to a central processing unit (CPU) 64. Temperatures of the respective card boards 10B–10R are thereby detectable in the central processing unit 64.

The central processing unit 64 is connected via a serial interface circuit 66 to the bus BUS, and the central processing unit 64 is connected via a serial I/O circuit 68 to an external device (switcher in this case) 60. The operations of the individual card boards 10B–10R may be changed in accordance with the external device 60.

Figure 9:
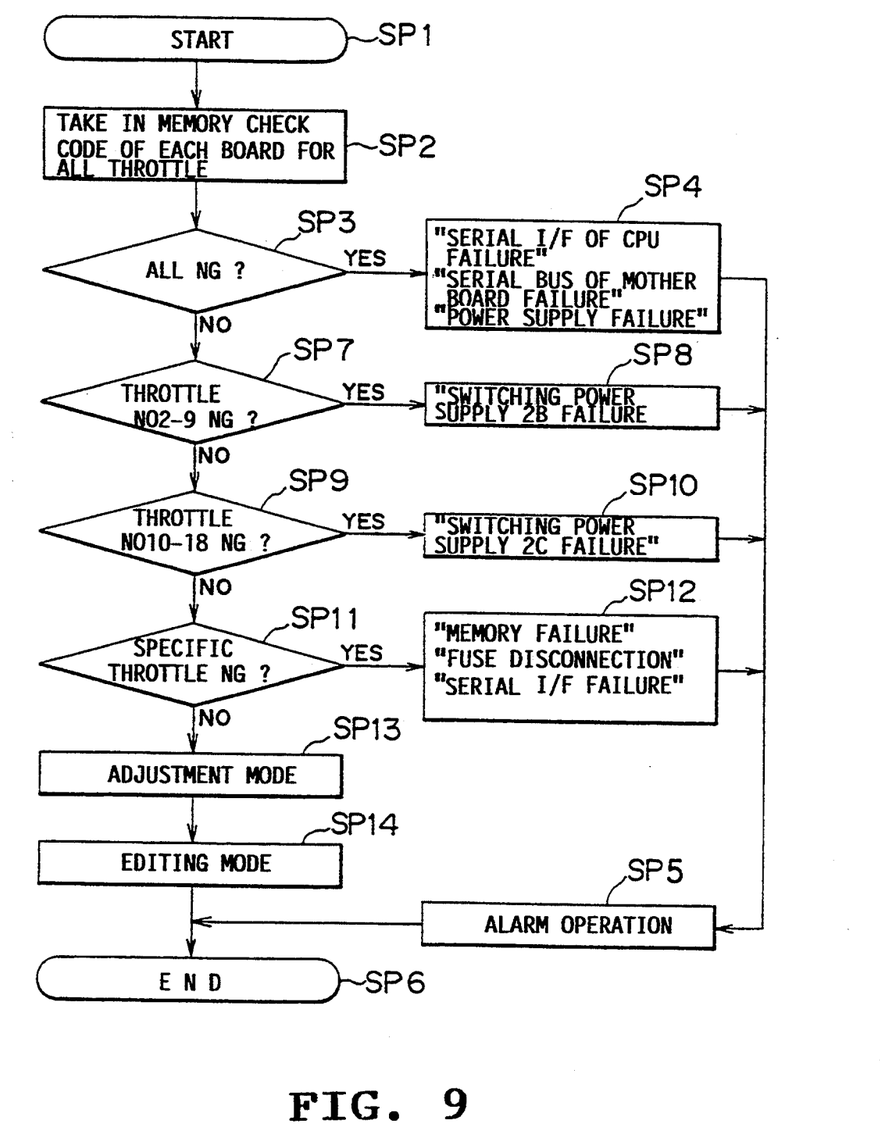
FIG. 9 is a flowchart showing a self-diagnosing process of the electronic device shown in FIG. 1.

The central processing unit 64 executes, when turning ON the power supply of the editing device 1, the self-diagnosis program shown in FIG. 9 and confirms the operation of the whole editing device 1.

To be more specific, the central processing unit 64 moves from step SP1 to step SP2, wherein the address data are sequentially outputted to the card boards 10B–10R. The unit 64 reads in the memory check data and throttle addresses ADS for each of the card boards 10B–10R.

Subsequently, the central processing unit 64 moves to step SP3 and diagnoses whether or not mistaken data about to all the card boards 10B–10R have been received on the basis of the common portion of the memory check data. If an affirmative result is obtained herein, the unit 64 moves to step SP4.

The central processing unit 64 causes the monitor device of the switcher 60 to display an error message and thereafter moves to step SP5, wherein a predetermined alarm is activated. The unit 64 subsequently moves to step SP6, wherein the processing procedures are ended.

Namely, if mistaken data about all the card boards 10B–10R have been received, it can be determined that a failure exists in at least one of the mother board 12, or the serial interface circuit 66 of the CPU board 10A, or the power supply.

Hence, in this case, the CPU controls and stops the operation of the editing device 1 after displaying items regarded as those failure portions in the form of error message.

The editing device 1 thus diagnoses an existence or non-existence of internal failures and accordingly activates an alarm at the start of use. The usability of the editing device is improved, correspondingly.

Whereas if a negative result is obtained in step SP3, the central processing unit 64 moves to step SP7, in which it is determined whether or not mistaken data about all the card boards 10B–10I located at the throttle numbers 2–9 have been received. If an affirmative result is obtained, the central processing unit 63 goes to step SP8.

To be specific, when mistaken data about all the card boards 10B–10I with the throttle numbers 2–9 have been received, it can be determined that a failure exists in the power supply 2B common to the card boards 10B–10I.

Hence, the central processing unit 64 moves to step SP5 after displaying an appropriate error message.

The editing device 1 is therefore constructed such that more detailed failure conditions are diagnosed and displayed, and the usability is improved, correspondingly.

Whereas if a negative result is obtained in step SP7, the central processing unit 64 moves to step SP9, wherein it is determined whether or not mistaken data about all the card boards 10J–10R located at the throttle numbers 10–18 have been inputted. If an affirmative result is obtained, the unit 64 goes on step SP10.

Namely, when mistaken data about all the card boards 10J–10R with the throttle numbers 10–18 have been received, it can be determined that a failure exists in the power supply 2C common to the card boards 10J–10R. The central processing unit 64 moves to step SP5 after displaying a message regarding the failure.

If a negative result is obtained in step SP9, the central processing unit 64 goes to step SP11, wherein it is determined whether or not mistaken data about the individual card boards 10B–10R located at specific throttle numbers have been received. If an affirmative result is obtained, the central processing unit 64 moves to step SP12.

Namely, where mistaken data about individual card boards 10B–10R with specific throttle numbers have been received, it can be determined that a failure exists in any portion of the memory circuits 48, the fuses or the serial interface circuits 30 of the card boards 10B–10R. The central processing unit 64 moves to step SP5 after displaying an appropriate failure message.

In the editing device 1, it is therefore possible to detect failures on the individual card boards 10B–10R. The usability of the editing device 1 is improved, correspondingly.

If a negative result is obtained in step SP11, the central processing unit 64 goes to step SP13 to enter an adjustment mode.

The central processing unit 64 compares the memory check data of the card boards 10B–10R with the throttle addresses ADS and detects whether or not the individual card boards 10B–10R are housed in the correct housing positions.

Namely, in this type of editing device 1, it is rare that the device is forwarded from the factory with all of the card boards 10B–10R. Optional card boards are selected by the users as needed.

In fact, rarely are all of the above-mentioned card board described above with FIG. 3 packaged together. The card boards in parenthesis are considered to be options.

For this reason, users have the opportunity to make the housing positions of the card boards, with the result that the editing device 1 does not operate correctly in some cases.

In the present embodiment, a mistake in the card board housing position is detected based on the throttle address ADS and the memory check data. This makes it possible to quickly provide correct service even if the user mistakenly considers that a failure exists. The usability of the editing device is improved, correspondingly.

Thus, if the card boards 16B–10R are not housed in the correct positions, the central processing unit 64 displays an appropriate message.

Subsequently, the central processing unit 64 reads the product information from the memory circuit 48 and obtains the contents of a memory circuit (not shown) mounted on the CPU board 10A and uses this information to determine whether or not the respective card boards can be packaged in the editing device 1.

That is, as discussed above, in this type of editing device 1, the card boards can be added as options, and a variety of products are prepared in accordance with the signal formats etc. even in the added card boards.

Hence, it may happen that the user mistakes the order of the card board or mistakenly sends the card board. Even in such a case, it is feasible to quickly provide correct service, as in the case of mistaking the card board housing position, by executing the self-diagnostic program.

Thus, in the case of products which can not be packaged in the card boards 10B–10R, the central processing unit 64 displays a message indicating this situation.

In contrast, when the card boards 10B–10R can be used in the editing device, the central processing unit or control circuit 64 reads the switch data and the volume data sequentially from the memory circuit 48 and outputs this read data to analog/digital converting circuit 40 and register circuit 36 of the respective card boards 10B–10R.

In the editing device 1, the characteristics of the individual card boards 10B–10R are thereby adjusted based on the operational setting information and adjustment information stored in the memory circuits 48 mounted on the card boards 10B–10R.

With this arrangement, even when inserting the card boards as options, the card boards are adjusted during forwarding from the factory. Desired characteristics are reliably and simply stored in the memory circuit 48.

As a matter of fact, when supplying this type of card boards as options, it has happened that the characteristics adjusted with much trouble by manipulating the half-fixed resistors have been altered due to a mistake of the user.

The characteristics of the half-fixed resistors vary during long-term use, as a result of which the operation characteristics of the card boards deviate from the initial characteristics in some cases.

Therefore, appropriately corrected adjustment information is stored in the memory circuit 48, and adjustment is effected based on this information. The above-mentioned long-term deviation of the operation characteristics can be thereby prevented, and the usability of the editing device is also improved.

With this arrangement, the respective card boards 10B–10R can be adjusted based on the output data of gate circuits 44, 46 mounted on the card boards 10B–10R without taking the trouble to insert an extension wiring board during adjustment of the whole editing device 1.

More specifically, in the editing device 1, a microcomputer-based adjustment unit is connected in place of the switcher 60, and the volume data can be adapted while monitoring the monitor data with the adjustment unit during the adjustment in the factory.

In the editing device 1, the adjustment operation can be thereby simplified, and simultaneously the adjustment operation itself can be automated.

As a matter of fact, in this type of electronic device, even when using the conventional half-fixed resistors, the adjustment operation can be automated by employing a dedicated jig.

In this type of editing device 1, however, a small quantity of multiple productions are performed, and hence, if such a dedicated jig is employed, a variety of jigs have to be prepared corresponding to the types of boards.

In the present embodiment, however, the output data of the gate circuits 44, 46 are monitored by using the predetermined adjustment unit, and the data of the memory circuit 48 are rewritten. This makes it possible to readily automate the adjustment operation.

Thus, the central processing unit 64, when completing the adjustment operation, moves to step SP14, wherein a changeover to an editing mode is effected. The control data are outputted to the respective card boards in accordance with the operation of the user. An editing process inherent in the editing device 1 is thereby executed.

Further, when completing the editing operation, the central processing unit 64 moves to step SP6 in accordance with the operation of the user. The processing procedures of FIG. 9 are thus ended.

The central processing unit 64 changes over to a display mode of service information when predetermined control data are inputted from the control unit while the microcomputer-based adjustment unit is connected instead of the switcher 60.

The central processing unit 64 reads the product and service information stored in the memory circuits 48 of the card boards 10B–10R in accordance with the operation of the operator and thereafter outputs the information to the control unit via the serial I/O circuit 68. The product and service information is then displayed.

When new service information, etc. is further inputted via the serial I/O circuit 68, the central processing unit 64 outputs the service information as write data WDATA to the corresponding card board, and the service information is then stored in the memory circuit 48 of the card board concerned.

Owing to this arrangement, the service person who visited the customer is able to easily grasp the condition of each card board and confirm when and how the card board underwent maintenance.

Hence, the usability of the editing device 1 is improved by improving its serviceability.

Further, when the product information is stored in the memory circuit 48 of each of the card boards, product management of the card boards can be effected by use of the product information in the factory or the like. The product management is simplified, correspondingly.

As a matter of fact, in this type of card boards, as described above, there exists a variety of card boards in which the adjustment is different, though the format is the same. This results in product management being troublesome.

When the product management is effected in the above-described manner, however, simple and reliable management is achieved.

Thus, the product information is stored in the memory circuits 48 together with the memory check data, format data and switch data during the adjustment in the factory and also is updated at the time of service as needed.

The central processing unit 64 access the memory circuits 48 of th respective card boards 10B–10R when the power supply is activated and loads temperature data together with the switch data, etc. at this time.

With respect to the temperature data, the editing device 1 is caused to operate at a predetermined temperature, and saturated voltages (hereinafter referred to as set saturated voltages) of the thermistors 24 mounted on the card boards 10B–10R at that time are stored in memory circuit 48. Temperatures of the card boards when operated in a known environment are thus recorded.

The central processing unit 64 subsequently detects, after loading the temperature data, terminal voltages of the individual thermistors 24 with respect to the card boards 10B–10R immediately after the power supply is activated.

The central processing unit 64 corrects the set saturated voltages which were loaded based on the detected terminal voltages.

The central processing unit 64 is constructed to detect the temperatures of the respective card boards 10B–10R when the editing device 1 normally operates at the ambient temperatures into which the editing device 1 is now brought.

Figure 10:
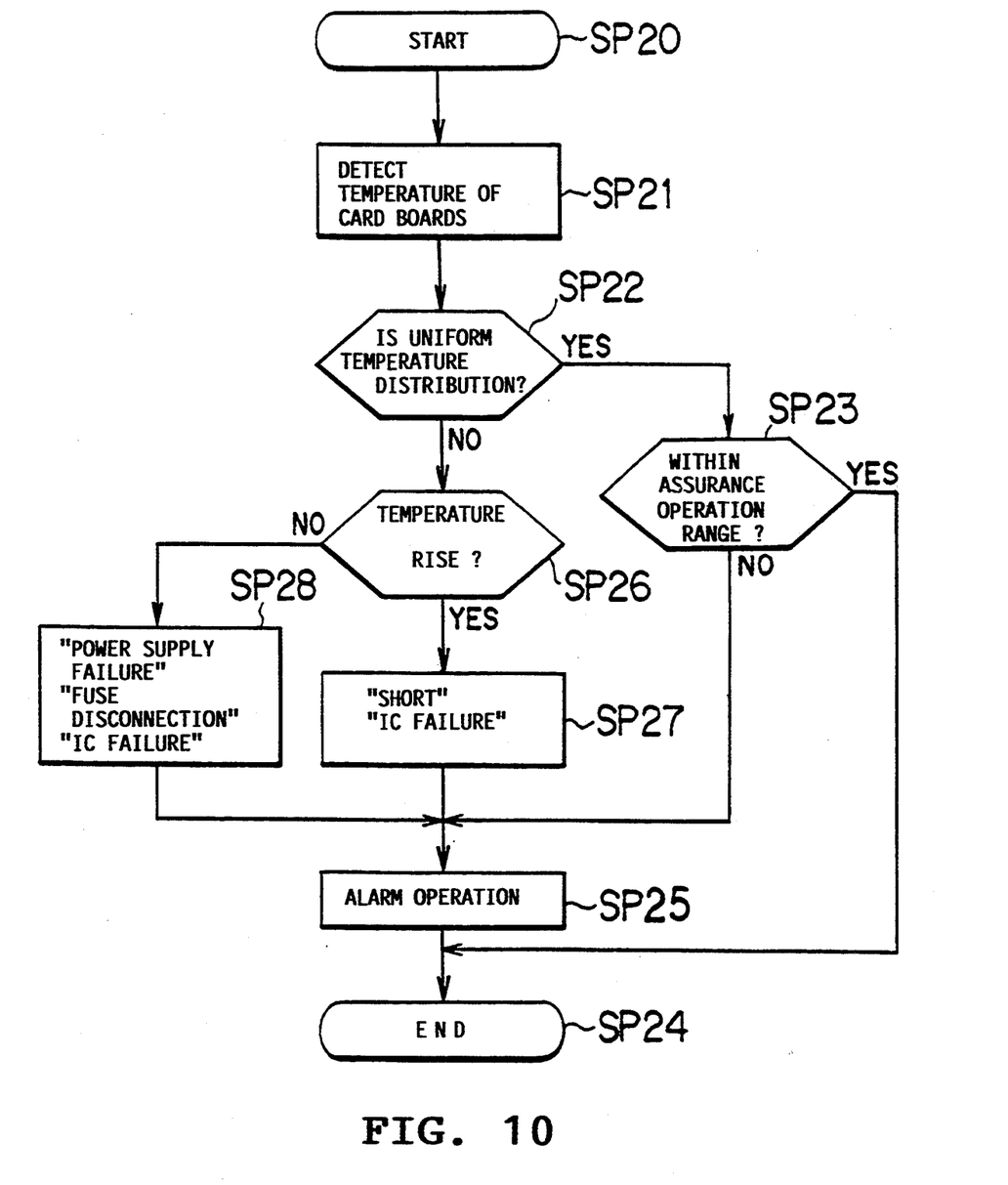
FIG. 10 is a flowchart showing a process of measuring temperatures of the card boards of the electronic device shown in FIG. 1.

The central processing unit 64 executes the processing procedures shown in FIG. 10 at a resetting time with predetermined periods and monitors the temperatures of the card boards.

Namely, the central processing unit 64 moves from step SP20 to step SP21, wherein the terminal voltages of the thermistors 24 are sequentially detected for each of the card boards 10B–10R. Thus temperatures of the card boards 10B–10R are thus detected.

Subsequently, the central processing unit 64 moves to step SP22 and decides whether or not the temperatures of the card boards 10B–10R are distributed within a predetermined range. Whether the temperature distribution of the card boards 10B–10R is uniform or not is thus determined. If an affirmative result is herein obtained, the unit 64 moves to step SP23.

At step SP23, the central processing unit 64 decides whether the temperatures of the card boards 10B–10R fall within an assurance operation range. If an affirmative result is obtained, the unit 64 goes to step SP24, wherein the processing procedures end.

Whereas if a negative result is obtained in step SP23, the central processing unit 64 moves to step SP25 and, after activating an alarm, further goes to step SP24 to finish the processing procedures.

Therefore, the editing device 1 is used within such a temperature range as to assure satisfactory operation, thereby preventing the failure and the like of the editing device 1.

Whereas if a negative result is obtained in step SP22, the central processing unit 64 moves to step SP26. A comparison with a previous measurement result is made to determine whether or not the temperature has risen.

If an affirmative result is obtained, the central processing unit 64 moves to step SP27, in which a predetermined error message is displayed. Thereafter, the unit 64 goes to step SP25 and activates the alarm.

Namely, if the temperature distribution of the card boards 10B–10R is not uniform, and when the temperature rises above the previous temperature measurement, it can be determined that an excessive current flow exists due to the failure of an ID and short-circuit within the card board.

Hence, the central processing unit 64 in this case prompts the user to be cautious by displaying the error message indicating this matter. A spread of failure is thus prevented.

Whereas if a negative result is obtained in step SP26, the central processing unit 64 moves to step SP28, wherein a predetermined error message is displayed. Thereafter, the unit 64 moves to step SP25 in order to activate the alarm.

That is, if the temperature distribution of the card boards 10B–10R is not uniform, and when the temperature has not increased above the previous measurement result, it can be determined that the temperature distribution is disturbed due to a drop in temperature. In this case, it can be also determined that the electric power consumption has decreased because of a fault of the power supply, disconnection of a fuse and failure of an IC.

Hence, the central processing unit 64 in this case prompts the user to be cautious by displaying the error message indicating this matter. The spread of failure is thereby prevented.

Figure 11:
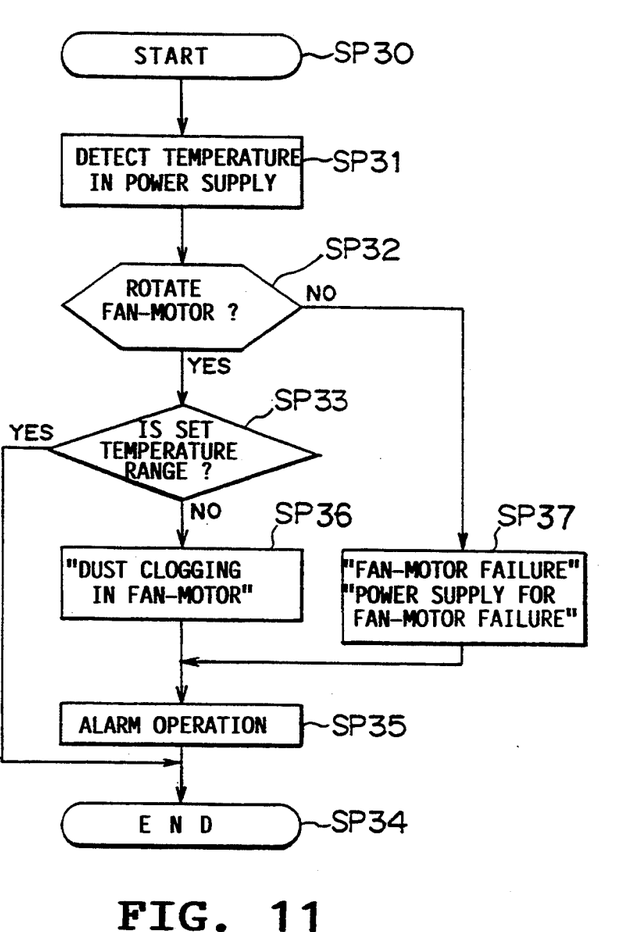
FIG. 11 is a flowchart showing a process of measuring a temperature of a box of the electronic device shown in FIG. 1.

If no failure is detected in the processing procedures shown in FIG. 10, the central processing unit 64 executes the processing procedures shown in FIG. 11 to detect if there is a failure in the interior of the box 3 of the editing device 1.

Namely, the central processing unit 64 moves from step SP30 to step SP31, wherein a terminal voltage of the thermistor 6 in the interior of the box 3 is detected. A temperature in the interior of the box 3 is thus detected.

Subsequently, the central processing unit 64 goes to step SP32 and decides whether or not fans 4A–4C rotate. If an affirmative result is obtained, the unit 64 goes to step SP33 to make a judgment as to whether the temperature falls within a set operation range.

The central processing unit 64, is an affirmative result is acquired, moves to step SP34, wherein the processing procedures are ended.

Therefore, the editing device 1 is employed within such a range as to assure satisfactory operation, thereby preventing the failure of the editing device 1.

Whereas if a negative result is obtained in step SP33, the central processing unit 64 goes to step SP36, in which a predetermined error message is displayed.

Subsequently, the central processing unit 64 moves to step SP35 to activate the alarm and thereafter goes to step SP34, wherein the processing procedures are finished.

Namely, if the temperature is outside the set range despite the fact that the fans 4A–4C are rotating, it is presumed that there are loadings in the fans 4A–4C and a failure of a rotation detecting mechanism for the fans 4A–4C. If allowed to persist, this probably leads to a serious fault.

Hence, the central processing unit 64 prompts the user to be cautious by displaying an error message indicating this matter, thereby preventing the spread of failure.

Whereas if it is determined that the fans 4A–4C do not rotate in step SP32, the central processing unit 64 moves to step SP37 to display a predetermined error message.

Subsequently, the central processing unit 64 goes to step SP35 to activate the alarm. The unit 64 thereafter moves to step SP34, and the processing procedures are finished.

That is, if the fans 4A–4C do not rotate, the fans 4A–4C do not rotate, the fans 4A–4C themselves and of the power supply for the fan motor are considered to have failed. If the editing device 1 is employed under this condition, its internal temperature increases, and there exists a possibility that failures will eventually take place in the respective portions of the editing device.

Hence, the central processing unit 64 prompts the user to be cautious by displaying the error message indicating this matter, thereby preventing occurrences of the failures.

If no failure is detected in these processing procedures, the central processing unit 64 corrects the volume data on the basis of the corrected set saturated voltage. Based on the corrected volume data, the adjusted circuits 42 of the respective card boards 10B–10R are adjusted.

As a matter of fact, in the device making use of this type of analog/digital converting circuit and serial/parallel converting circuit, it is required that the temperatures of these circuits be compensated for so as to operate within a wide temperature range.

Therefore, in this embodiment, the temperatures of the card boards 10B–10R are monitored with the aid of the thermistors 24. Simultaneously, the preset volume data are corrected based on the result of the temperature detection and adjusted, thus effecting the temperature compensation of the adjusted circuit 42. It is therefore possible to reliably and easily compensate the temperature of the whole editing device 1.

Further, if the adjustment control unit is connected instead of the switcher 60, and the editing device is set to a monitor mode through the control unit, the central processing unit 64 outputs the results of detecting the temperatures of the card boards to the control unit.

With this arrangement, in the editing device 1, an internal temperature distribution can be monitored according to need. It is thus possible to quickly analyze the failures and detect the portions of failures.

Based on the construction discussed above, the memory check data, the format data, the switch data, etc. are stored in the memory circuits 48 of the individual card boards 10B–10R of the editing device 1, and the card boards are then forwarded.

At the starting time, in the editing device 1, the memory check data of the card boards 10B–10R are read to the CPU board 10A to make a judgment. A self-diagnosis of the failure portion is thereby effected.

Obtained upon a completion of self-diagnosis are the memory check data and the comparison results of the throttle addresses allocated to the respective throttles. Whether or not the card boards are housed in the correct positions is thereby judged.

Subsequently, the editing device 1 reads the product information of the card boards 10B–10R read to the CPU board 10A, to determine whether or not the card boards 10B–10R are those applicable to the editing device 1.

Further, the editing device 1 reads the volume data and the switch data of the card boards 10B–10R to the CPU board and sends this data back to the respective card boards 10B–10R. The card boards are adjusted to the characteristic when forwarding them from the factory.

The editing device 1 then executes, after setting the characteristics of the whole editing device 1 to a predetermined state, a desired editing process in accordance with the operation of the switcher 60 which is to be manipulated subsequently.

Alternatively, the dedicated control unit can be connected in place of the switcher 60 as in the case of service and factory forwarding. The product and service information of the card boards 10B–10R is read via the control unit and the CPU board 10A and updated as the necessity arises.

Consequently, the serviceability of the editing device 1 is improved.

At start-up, in the editing device 1, the temperature data are loaded from the respective memory circuits 48, and a normal operation temperature is detected.

In this state, the editing device 1 detects temperatures of the card boards 10B–10R at the resetting time with predetermined periods. Based on the detected results, a failure of the editing device 1 can be detected.

On the basis of the thermistor mounted on the box 3, a failure of the editing device 1 can be similarly detected.

Based on the detected temperature data, the volume data are outputted after being corrected, thus compensating the temperature of the entire editing device 1.

Also, the results of the temperature detections are outputted to make external monitoring possible.

According to the construction discussed above, the adjustment or operational setting data are stored in the card boards 10B–10R, and the card boards 10B–10R are in turn adjusted based on the adjustment data, that is, their operational settings are controlled based on the operational setting data. The card boards 10B–10R can thus be easily adjusted simply by rewriting the adjustment data.

The adjustment data and the like are serially transmitted, thereby simplifying the construction of the editing device. In addition to the adjustment data, the service data, self-diagnosis data and identification data of the card boards 10B–10R are stored, whereby the product management can be done by making use of those data. The usability of the editing device 1 can be thus improved.

The above described embodiment has dealt with the case where the temperature of the respective card board is detected by the thermistor. The present invention is not, however, limited to this arrangement but is applicable widely to cases of using multiple temperature detecting elements.

Besides, the embodiment discussed above has dealt with the case of employing 18 card boards. The present invention is not, however, limited to this arrangement but is applicable widely to cases of using multiple numbers of card boards according to necessity.

Further, the embodiment described above has dealt with the case where this invention is applied to an editing device. The present invention is not, however, limited to this device but is applicable widely to a variety of electronic devices which use a main wiring board and a plurality of sub-wiring boards.

As discussed above, the operational setting data for register 36, the adjustment data for adjusted circuit 42, self-diagnosis data and identification data are stored in the memory circuits of the respective sub-wiring boards and circuits on the respective sub-wiring boards are controlled based on the stored data. The individual card boards are readily adjustable simply by rewriting the adjustment data. The adjusting operation is simplified, correspondingly.

Further, the adjustment data are serially transmitted at this moment, thereby simplifying the whole construction. Additionally, the product management and the diagnosis of failure can be performed by using the product data, self-diagnosis data and identification data. The usability of the editing device 1 is thus improved.

Furthermore, in the present invention, based on the result of temperature detections of the respective sub-wiring boards 10B–10R, the stored data is updated to compensate for temperature changes so that the electronic device can be easily temperature compensated.

Although an illustrative embodiment of the present invention, and various modifications thereof, have been described in detail herein with reference to the accompanying drawings, it will be understood by those skilled in the art that various changes and modifications may be made therein without departing from the invention, and it is intended, therefore, to cover in the appended claims all such changes and modifications as fall within the true spirit and scope of the invention.

What is claimed is:

1. An electronic device comprising:
   a plurality of sub-wiring boards each having mounted thereon at least one circuit block with an operational setting and a memory circuit for storing operational setting data for said at least one circuit block;
   a temperature detection element included in each of said sub-wiring boards for measuring a temperature of said each sub-wiring board; and
   a main-wiring board respectively connected to said sub-wiring boards, said main-wiring board having a control circuit for controlling said operational setting of said at least one circuit block mounted on each of said plurality of sub-wiring boards on the basis of said operational setting data stored in said memory circuit on the respective sub-wiring board, and said control circuit corrects said operational setting data on the basis of the temperature measured by said temperature detection element.

2. The electronic device according to claim 1, wherein a first transmission form of data which are transmitted from said memory circuit mounted on said each sub-wiring board to said control circuit mounted on main-wiring board and a second transmission form of data which are transmitted from said control circuit mounted on said main-wiring board to said circuits mounted on said each sub-wiring board are a serial data transmission form.

3. The electronic device according to claim 1, wherein said memory circuit mounted on said each sub-wiring board further stores data for respectively indicating product information.

4. The electronic device according to claim 1, wherein said memory circuit mounted on said each sub-wiring board further stores data for self-diagnosing, said control circuit mounted on said main-wiring board detecting the abnormality of said circuits mounted on said each sub-wiring board on the basis of said data for self-diagnosing.

5. The electronic device according to claim 1, wherein said memory circuit mounted on said each sub-wiring board further stores identification data for said sub-wiring board, said control circuit mounted on said main-wiring board judging whether or not said each sub-wiring board houses at a correct position on the basis of said identification data.

6. The electronic device according to claim 1, wherein:
   said control circuit mounted on said main-wiring board inputs or outputs transmission data through input/output circuits among predetermined external devices; and
   said memory stores said input/output data in addition to said adjusting data for said sub-wiring board.

* * * * *